US008845844B2

(12) United States Patent
Ishikawa et al.

(10) Patent No.: US 8,845,844 B2
(45) Date of Patent: Sep. 30, 2014

(54) VACUUM LAMINATION SYSTEM AND VACUUM LAMINATION METHOD

(71) Applicant: Kabushiki Kaisha Meiki Seisakusho, Ohbu (JP)

(72) Inventors: Koji Ishikawa, Nishio (JP); Tomoaki Hirose, Ohbu (JP)

(73) Assignee: Kabushiki Kaisha Meiki Seisakusho, Ohbu-shi (JP)

( * ) Notice: Subject to any disclaimer, the term of this patent is extended or adjusted under 35 U.S.C. 154(b) by 0 days.

(21) Appl. No.: 13/670,704

(22) Filed: Nov. 7, 2012

(65) Prior Publication Data

US 2013/0118684 A1    May 16, 2013

(30) Foreign Application Priority Data

Nov. 10, 2011   (JP) .................. 2011-246464

(51) Int. Cl.
*B29C 65/00* (2006.01)
*B32B 37/00* (2006.01)
(Continued)

(52) U.S. Cl.
CPC ......... *B32B 37/1009* (2013.01); *B32B 2457/14* (2013.01); *H01L 21/67132* (2013.01); *H01L 21/67092* (2013.01)
USPC ............. 156/285; 156/286; 156/382; 264/87; 264/511; 264/526; 264/553; 264/571; 425/504; 425/388; 425/405.1

(58) Field of Classification Search
CPC .............. B65H 1/08; B65H 1/14; B65H 3/32; B65H 3/40; B65H 3/44; B65H 5/02; B65H 5/021; B65H 5/023; B65H 5/025; B65H 5/026; B65H 5/062; B65H 5/064; B65H 5/066; B65H 5/068; B65H 5/28; B65H 9/16; B65H 9/166; B65H 11/002; B65H 16/00; B65H 16/02; B65H 16/021; B65H 16/023; B65H 18/00; B65H 18/08; B65H 23/00; B29C 65/00; B29C 65/02; B29C 65/44; B29C 65/48; B29C 65/4815; B29C 65/7841; B29C 65/7847; B29C 65/787; B29C 66/00145; B32B 17/10; B32B 17/064
USPC ............ 156/285, 286, 382; 264/87, 511, 526, 264/553, 571; 425/504, 388, 405.1, 405.2
See application file for complete search history.

(56) References Cited

U.S. PATENT DOCUMENTS 2,111,156 A * 3/1938 Schneider et al. ............... 83/98
5,466,321 A * 11/1995 Miyaji ......................... 156/260

FOREIGN PATENT DOCUMENTS

JP      A-2002-134438      5/2002
JP      2004-299146      * 10/2004
(Continued)

OTHER PUBLICATIONS

Hirose, Tomoaki. "Laminate Molding Device and its Method, Detailed Description." May 1, 2007. JP 2008-272899.*

(Continued)

*Primary Examiner* — Richard Crispino
*Assistant Examiner* — Matthew Hoover
(74) *Attorney, Agent, or Firm* — Oliff PLC

(57) ABSTRACT

A vacuum lamination system and a vacuum lamination method are provided in which, when a laminate film and laminate base items are laminated and an excessive portion of the laminate film is cut from the laminated item having the laminate film laminated thereon, a high precision lamination is enabled and the cutting process including a conveying device for cutting the excessive portion of the laminate film can be simplified. In the vacuum lamination system, a laminate film and laminate base items that are conveyed on the carrier film are laminated by the batch type vacuum laminating device, and the laminate film is cut from the laminated item having the laminate film laminated thereon.

4 Claims, 2 Drawing Sheets

(51) Int. Cl.
| | |
|---|---|
| *B28B 1/26* | (2006.01) |
| *B29C 45/00* | (2006.01) |
| *B29C 47/00* | (2006.01) |
| *B29C 39/02* | (2006.01) |
| *B29C 43/02* | (2006.01) |
| *B29C 49/00* | (2006.01) |
| *B29C 49/08* | (2006.01) |
| *B29C 67/00* | (2006.01) |
| *B29D 22/00* | (2006.01) |
| *B29C 51/00* | (2006.01) |
| *B29D 29/00* | (2006.01) |
| *B29D 24/00* | (2006.01) |
| *B29C 43/10* | (2006.01) |
| *B28B 21/36* | (2006.01) |
| *A01J 21/00* | (2006.01) |
| *A01J 25/12* | (2006.01) |
| *A21C 3/00* | (2006.01) |
| *A21C 11/00* | (2006.01) |
| *A23G 1/20* | (2006.01) |
| *A23G 3/02* | (2006.01) |
| *A23P 1/00* | (2006.01) |
| *B28B 11/08* | (2006.01) |
| *B29C 55/28* | (2006.01) |
| *H01L 21/67* | (2006.01) |
| *B32B 37/10* | (2006.01) |

(56) References Cited

FOREIGN PATENT DOCUMENTS

| | | |
|---|---|---|
| JP | A-2004-299146 | 10/2004 |
| JP | 2008272899 A * | 11/2008 |
| JP | A-2008-272899 | 11/2008 |
| JP | A-2009-032853 | 2/2009 |

OTHER PUBLICATIONS

Hirose, Tomoaki. "Laminate Molding Device and its Method, Drawings." May 1, 2007. JP 2008-272899.*

Koyama, Masayoshi. "Laminator and Laminating Method." Oct. 2004. Japanese Patent Office. Detailed Description.*

Koyama, Masayoshi. "Laminator and Laminating Method." Oct. 2004. Japanese Patent Office. Drawings.*

* cited by examiner

VACUUM LAMINATION SYSTEM AND VACUUM LAMINATION METHOD

BACKGROUND OF THE INVENTION

1. Field of the Invention

The present invention relates to a vacuum lamination system and a vacuum lamination method, in which after a laminate film and a laminate base item are laminated, the laminate film is cutoff from the laminated item having the laminate film laminated thereon.

2. Description of Related Art

As the technique for laminating a laminate film such as NCF to a laminate base item such as semiconductor wafer and then cutting the excessive portion of the laminate film off the wafer having the laminate film laminated thereon, it has been known that the techniques described in Japanese Patent Application Laid-Open (JP-A) No. 2009-32853 (0017 to 0019, FIG. 1), JP-A No. 2002-134438A (0045 to 0049, FIGS. 11 and 13) and so on. According to JP-A No. 2009-32853 (0017 to 0019, FIG. 1), the adhesive sheet is directly cut in accordance with the shape of wafer by the cutting blade at the position where the adhesive sheet is pressed and adhered to the wafer. In JP-A No. 2009-32853 (0017 to 0019, FIG. 1), however, the position where the adhesive sheet is pressed to a wafer and the position where the adhesive sheet is cut are the same, and a cutting unit is disposed at the outer peripheral side of the pressing unit. Therefore, limitations are imposed on the pressing of the adhesive sheet to a wafer or constraints are applied to the cutting of the excessive portion of the adhesive sheet from the wafer having the adhesive sheet adhered thereto. Specifically, as described in FIG. 1 of JP-A No. 2009-32853 (0017 to 0019, FIG. 1), the portion to be cut by the cutting unit is positioned in the outside of the area to be pressed and adhered by the first rubber-like pressing unit. Therefore, in JP-A No. 2009-32653 (0017 to 0019, FIG. 1), while air between the adhesive sheet and the wafer is expelled, at the portion closer to the outside of the wafer, by the rotatably moving press roller, the adhesive sheet and the wafer are affixed. In the method for affixing an adhesive sheet to a wafer in two stages as described above, however, it cannot be expected that the adhesive sheet is affixed uniformly to the entire surface of the wafer. Further, in JP-A No. 2009-32853 (0017 to 0019, FIG. 1), there is no description that pressing by an elastic rubber sheet is performed in a vacuum state, and it is not expected that use of a press roller leads to a good affixation with air being completely expelled.

In JP-A No. 2002-134438 (0045 to 0049, FIGS. 11 and 13), a die bond tape is affixed to a wafer using an application roll on a wafer mounting table, and after the application roll is moved, the tape is, in the same position, cut by the cutting blade in accordance with the shape of the wafer. In JP-A No. 2002-134438 (0045 to 0049, FIGS. 11 and 13), however, affixation of wafer is performed by the application roll, and there have been problems described below. There has been a problem in which since the application roll can compress only a limited area at a time, a high-pressure compression is partially applied to a wafer. In addition, there has been a problem in which when pressure is applied to a round-shape wafer from one side toward the other side by the application roll, the compression force applied by the application roll differs among at the starting portion, the ending portion and the middle portion because the length of compressed wafer is differed. Furthermore, the application roll moves from one side toward the other side of the wafer surface, and in the case where a wafer has projections such as bumps, a lateral force is applied to the wafer and the projections fall down.

In recent years, there have been cases in which laminations under stricter conditions than the conventional lamination conditions are required, such as lamination of film to wafers having fine projections such as bumps, lamination of film to wafers which are much thinner than conventional wafers or lamination to conventional wafers requiring a higher precision and uniform quality without void. But in some of the above cases, the conventional laminating devices cannot fully satisfy the conditions. Therefore, use of a batch type vacuum laminating device as described in JP-A No. 2008-272899 (claim 1, FIG. 1) for lamination of wafer has been considered. In the case of JP-A No. 2008-272899 (claim 1, FIG. 1), a continuous belt-shaped material to be laminated and a laminate material are laminated by the vacuum laminating device while being sandwiched between the upper and lower carrier films, and then the upper and lower carrier films are delaminated. Thereafter, the belt-shaped laminated item is cut in a predetermined length.

It is difficult, however, to use the vacuum laminating device and the cutting device of JP-A No. 2008-272899 (claim 1, FIG. 1) for lamination of wafer and cutting of film, because of the reasons described below. In the case of lamination of wafer, round-shape wafers are conveyed one by one. Therefore, the process described in JP-A No. 2008-272899 (claim 1, FIG. 1), by which only the belt-shaped laminated item is taken out and cut after the carrier film is delaminated, cannot be used. In addition, it may be possible to move wafers having film laminated by the vacuum laminating device of JP-A No. 2008-272899 (claim 1, FIG. 1) to the cutting device disposed at a different position by another conveying device different from a carrier film, but disposition of another conveying device is disadvantageous in terms of cost and space.

Furthermore, the laminate base items in the above-described configuration are not limited to wafer but include other non-continuous, single-body laminate base items (such as circuit board). The similar problems occur in cutting of the excessive portion of the laminate film from the laminated circuit board after lamination by the batch type vacuum laminating device is completed.

RELATED ART DOCUMENTS

Patent Document 1: JP-A 2009-32853
Patent Document 2: JP-A 2002-134438
Patent Document 3: JP-A 2008-272899

SUMMARY OF THE INVENTION

As described above, in the conventional laminating devices for wafer, there has been a problem in which wafer cannot be laminated with a high precision. In the case where laminate base items such as wafers that are conveyed are laminated using the batch type vacuum laminating device, the structure and arrangement of the device for cutting the laminated items after lamination and the technology for the device for conveying the laminated items to the cutting device have not been established.

Therefore, an object of the present invention is to provide a vacuum lamination system and a vacuum lamination method, by which when a laminate film and a laminate base item are laminated and then the excessive portion of the laminate film is cut from the laminated item having the laminate film laminated thereon, a high precision lamination is enabled and the cutting process including a conveying device for cutting the excessive portion of the laminate film is simplified. The second object of the present invention is to provide a vacuum lamination system and a vacuum lamination method by which in the case where a laminate base item is a round-shape wafer, when a laminate film and a wafer are laminated and then the excessive portion of the laminate film is cut from the wafer having the laminate film laminated thereon, a high precision lamination to the wafer is enabled and the cutting process including a conveying device for cutting the excessive portion of the laminate film is simplified.

The vacuum lamination system in accordance with a first aspect of the present invention is a vacuum lamination system in which a laminate film and laminate base items that are conveyed on a lower carrier film are laminated by a batch type vacuum laminating device and the laminate film is cut from the laminated item having the laminate film laminated thereon, and in a state in which the laminated item having the laminate film laminated thereon is mounted on the lower carrier film, the excessive portion of the laminate film is cut off from the laminated item having the laminate film laminated thereon.

In the vacuum lamination system in accordance with a second aspect of the present invention, the laminate base item, in the first aspect, is a round-shape wafer, the laminate film is a continuous laminate film or a laminate film cut into a rectangle, and the laminate film is cut in accordance with the shape of the laminated wafer having the laminate film laminated thereon.

In the vacuum lamination system in accordance with a third aspect of the present invention, the cut-off excessive portion of the laminate film according to the first or second aspect is wound up together with the lower carrier film.

The vacuum lamination method in accordance with a fourth aspect of the present invention includes the steps of: laminating a laminate film and laminate base items that are conveyed on a lower carrier film by a batch type vacuum laminating device; and cutting the laminate film from the laminate base item having the laminate film laminated thereon. In a state in which the laminated item having the laminate film laminated thereon is mounted on the lower carrier film, the excessive portion of the laminate film is cut off from the laminated item having the laminate film laminated thereon.

In the vacuum lamination method in accordance with a fifth aspect of the present invention, the laminate base item, in the fourth aspect, is a round-shape wafer, the laminate film is a continuous laminate film or a laminate film cut into a rectangle, and the laminate film is cut in accordance with the shape of the wafer having the laminate film laminated thereon.

In the vacuum lamination method in accordance with a sixth aspect of the present invention, the cut off excessive portion of the laminate film in the fourth or fifth aspect is wound up together with the lower carrier film.

EFFECTS OF THE INVENTION

In the vacuum lamination system and the vacuum lamination method of the present invention, when a laminate film and laminate base items that are conveyed on a lower carrier film are laminated by a batch type vacuum laminating device and then, the laminate film is cut from the laminated item having the laminate film laminated thereon, the excessive portion of the laminate film is cut from the laminated item having the laminate film laminated thereon in a state in which the laminated item having the laminate film laminated thereon is mounted on the lower carrier film, allowing simplification of the cutting process including a conveying device.

DETAILED DESCRIPTION OF PREFERRED EMBODIMENT

Figure 1:
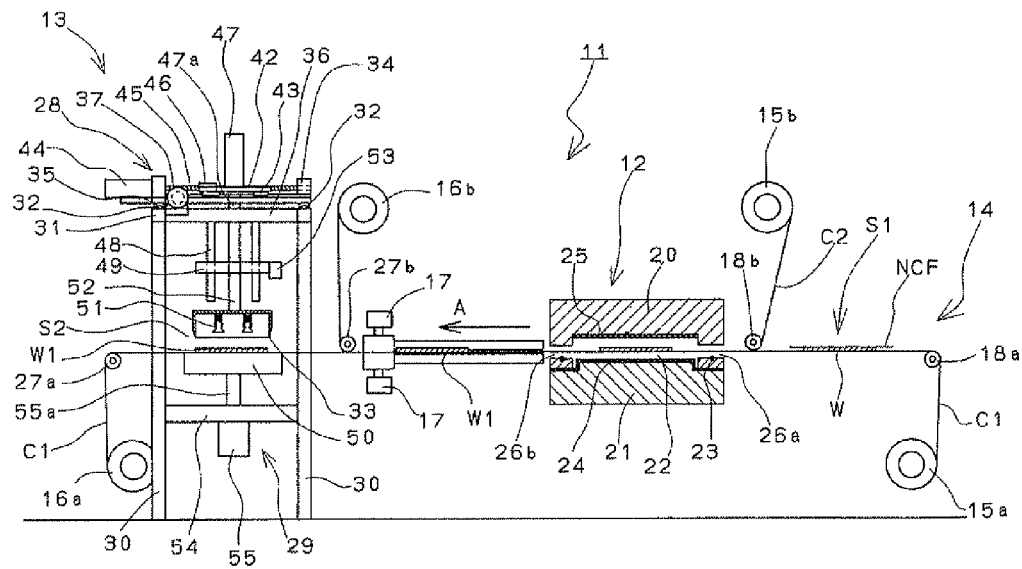
FIG. 1 is a side view of the vacuum lamination system according to the embodiment of the present invention.
Figure 2:
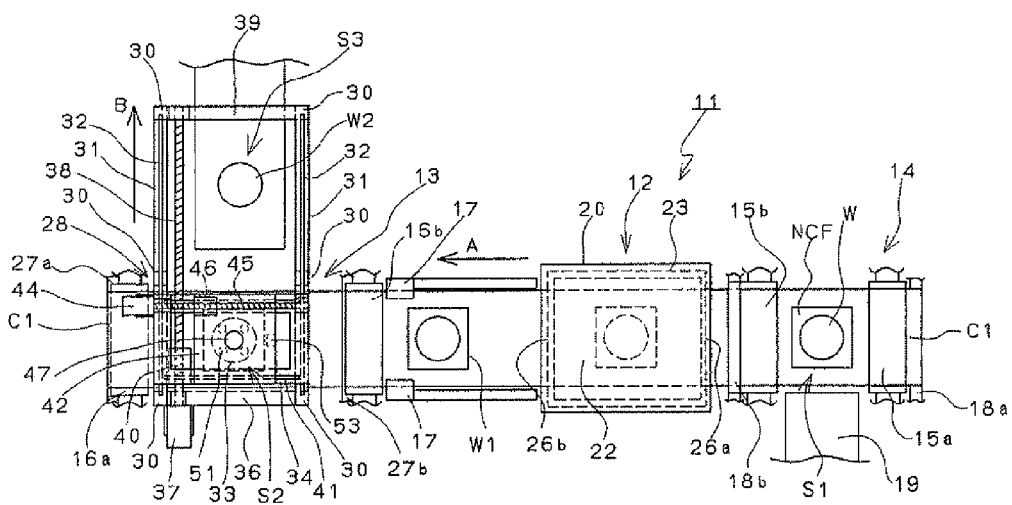
FIG. 2 is a front view of the vacuum lamination system according to the embodiment of the present invention.

The vacuum lamination system 11 of this embodiment includes, as shown in FIGS. 1 and 2, a batch type (which is not a continuous forming method but a forming method where forming and stop of formation/conveyance are alternately repeated) vacuum laminating device 12, a cutting device 13 and a conveying device 14 which conveys an NCF as a laminate film and a wafer W as a laminate base item that are superposed into the vacuum laminating device 12 and conveys the wafer W1 having an NCF laminated thereon (hereinafter, simply abbreviated as an NCF laminated wafer W1) to the cutting device 13. The types of wafer W1 are broadly classified into two; wafer made of silicon and wafer made of glass (sapphire glass). A wafer made of silicon is used for LSI, D-RAM and so on. A wafer made of glass is used for light emitting elements of LED and so on. To a wafer made of glass, film such as the above-mentioned NCF or BG tape is affixed. The conveying device 14 includes upper and lower carrier films C1, C2, unwinding rolls 15a, 15b that are feed devices of carrier films, wind-up rolls 16a, 16b and a zipped film conveying device 17. As shown on the right portion of FIG. 1, the mounting stage S1 is formed, where the lower carrier film C1 is unwound from the unwinding roll 15a and the film is conveyed in the horizontal position by a predetermined length via the roller 18a. Then, a wafer W and a cut-to-size NCF superposed on the upper surface of the wafer are conveyed from the conveying/superposing device 19 in the preceding process to the mounting stage S1 shown in FIG. 2 with the details omitted. At the position on the side toward the vacuum laminating device 12 from the mounting stage S1, the upper carrier film C2 from the upper unwinding roll 15b is superposed on the wafer W and NCF via the roller 18b. Then, the wafer W and NCR in the state of being sandwiched between the carrier films C1, C2 are conveyed into the batch type vacuum laminating device 12. It is preferable that the upper and lower unwinding rolls 15a, 15b are controlled by a torque motor or a servomotor having a brake function and the carrier films C1, C2 are conveyed with tension applied thereto.

The batch type vacuum laminating device 12 is provided with a fixed upper plate 20 and a lower plate 21 that is in parallel with the upper plate 20 and can be raised and lowered. When the lower plate 21 is raised, a chamber 22 is formed between the upper plate 20 and the lower plate 21. The chamber 22 is sealed and enclosed by a sealing member 23 disposed on at least one of the lower plate 21 and the upper plate 20 and is vacuumed using a vacuum pump, not shown, that is connected to the chamber 22. On the upper surface of the lower plate 21, a rubber membrane body 24 (diaphragm), which is bloated by compressed air supplied from below by a compressor, is disposed with its periphery fixed. Also, on the lower surface of the other upper plate 20, a rubber membrane body 25 is affixed. The upper plate 20 and the lower plate 21 can be heated by heaters, not shown, respectively. When the chamber 22 of the vacuum laminating device 12 is opened, the carrier films C1, C2 can be moved from the inlet 26a side toward the outlet 26b side between the upper plate 20 and the lower plate 21.

The vacuum laminating device 12 is not limited to the above configuration but may be disposed with a rubber film (diaphragm) which is bloated by compressed air supplied in the upper plate 20 side, and the rubber film may be bloated by normal pressure, not using compressed air, in the chamber 22 being in a vacuum state. The vacuum laminating device 12 may be configured to press wafers by a plate-shape elastic member made of rubber, porous resin or buffer material, without using a bloated rubber film, in a chamber being in a vacuum state. Alternatively, a thin metal plate affixed on the compression surface may be used. In any case, in the batch type vacuum laminating device, an compression can be applied over the entire surface of wafer W by compressing a laminate base item such as wafer W and a laminate film such as NCF by an elastic member over a certain period of time.

In the subsequent process of the vacuum laminating device 12, a zipped film conveying device 17 is disposed, which holds both sides of the carrier films C1, C2, which have the laminated NCF laminate wafer W1 (hereinafter, simply abbreviated as NCF laminated wafer W1) sandwiched therebetween, from above and below and conveyed to the subsequent process. The horizontal moving amount of the zipped film conveying device 17 agrees with the distance from the mounting stage S1 to the forming position in the chamber 22 of the vacuum laminating device 12. In the present invention, the zipped film conveying device 17 is not necessarily required, and the carrier films C1, C2 may be wound up only by the wind-up rolls 16, 16b driven by motor or servomotor, not shown. Alternatively, a servomotor may be used to drive nip rolls besides wind-up rolls 16, 16b to control the winding amount of the carrier films C1, C2.

At the position on the side toward the subsequent process from the zipped film conveying device 17, the upper carrier film C2 is delaminated from the NCF laminated wafer W1 by the upper roller 27b and the upper carrier film C2 is wound up by the wind-up roll 16b. On the other hand, the lower carrier film C1 on which the NCF laminated wafer W1 is mounted is horizontally conveyed, with tension being applied, by a predetermined length, to the cutting stage S2. The cutting stage S2 is provided with the cutting device 13.

The cutting device 13 includes a cutting mechanism 28 disposed in the position higher than the lower carrier film C1 and a film tension mechanism 29 disposed in the position lower than the lower carrier film C1. On both sides of the conveying direction of the lower carrier film C1, a plurality of support columns 30 are disposed in the vertical direction. On the top of the support columns 30, two beam members 31 are horizontally disposed along the direction B orthogonal to the conveying direction A of the lower carrier film C1. As shown in FIG. 2, the beam members 31 extend lengthwise from above the lower carrier film C1 toward above the convey-out stage S3 of NCF laminated wafer W2 after the excessive portion of NCF is cutoff (hereinafter, simply abbreviated as NCF laminated wafer W2). On the upper surface of the beam members 31, the rails 32 for linear guide are disposed. On the rails 32, a carriage 34 having a housing 35 for linear guide on both sides of the lower surface is disposed. The housing 35 is configured so that the carriage 34 is moved by being guided by the rails 32.

On the top of two support columns 30, 30 at one side of the lower carrier film C1, a beam member 36 is disposed in parallel with the conveying direction A of the lower carrier film C1. On the bracket projecting from the beam member 36 laterally, a servomotor 37 for moving the carriage 34 is provided. Alternatively, by a bearing disposed on the upper surface of the beam member 36, the ball screw 38 is supported pivotally and one end of the ball screw 38 and the drive shaft of the servomotor 37 are connected by coupling. The other end of the ball screw 38 is supported pivotally by the beam member 39 disposed over the convey-out stage S3 of NCF laminated wafer W2. A ball screw nut 40 is movably installed to the ball screw 38, and the ball screw nut 40 is fixed to the carriage 34. Therefore, when the drive shaft of the servomotor 37 is rotated, the ball screw 38 is rotated in the same position, and the ball screw nut 40 and the carriage 34 moves linearly along the axial direction of the ball screw 38.

On the upper surface of the carriage 34, two rails 41 for linear guide are disposed in parallel with the conveying direction A of the lower carrier film C1, and the portion between the rails 41 of the carriage 34 is open by a certain area. On the rails 41, the upper moving member 42 having the housings 43 for linear guide on both sides of the lower surface is disposed. The housings 43 are configured to be guided by the rails 41 and move the upper moving member 42. On the bracket projecting from the carriage 34 toward the lateral side, a servomotor 44 for moving the upper moving member 42 is disposed. Alternatively, by a bearing disposed on both sides of the upper surface of the carriage 34, the ball screw 45 is supported pivotally and one end of the ball screw 45 and the drive shaft of the servomotor 44 are connected by coupling. A ball screw nut 46 is movably installed to the ball screw 45, and the ball screw nut 46 is fixed to the upper moving member 42. Therefore, when the drive shaft of the servomotor 44 is rotated, the ball screw 45 is rotated, and the ball screw nut 46 and the upper moving member 42 moves linearly along the axial direction (conveying direction A) of the ball screw 45.

Therefore, with the operation of the two servomotors 37, 44, the ball screws 38, 45 of the ball screw mechanism and the ball screw nuts 40, 46, the upper moving member 42 can move in the XY direction (in the horizontal direction) at the position above the cutting stage S2 of the lower carrier film C1. A cutting blade 33 of the cutting mechanism 28 or the like is mounted downwardly from the upper moving member 42. Specifically, on the upper surface of the upper moving member 42, an electric cylinder 47 is fixed with the rod 47a pointing downward. The electric cylinder 47 operates with the rod 47a being closed-loop controlled by a servomotor or the like and enables a high precision raising and lowering control in micron units. On the lower surface of the upper moving member 42, two guide members 48 are disposed in parallel with the rod 47a. The member 49 horizontally fixed to the tip end side of the rod 47a has guide holes, and the guide members 48 are inserted through the guide holes of the member 49 so that the member 49 can be raised and lowered along the guide members 48. The rod 47a and the guide members 48 project downwardly from the space that is open between the rails 41 of the carriage 34.

Under the member 49, another rod 52 is fixed pointing downward, and the round-shape cutting blade 33 or the like is fixed to the rod 52 with the cutting blade pointing downward. The cutting blade 33 cuts off the excessive portion NCFa of NCF from the NCF laminated wafer W1. The cutting blade 33 is replaceable according to the diameter of a wafer W to be laminated or wear of the cutting blade. The cutting blade 33 of the cutting mechanism 28 is not limited to the blade having the structure shown in the drawing, but it may be configured so that the cutting blade which is disposed at a certain distance from a rotation shaft core and has a blade formed on the lateral side moves on a round-shape arc along the outer periphery of NCF laminated wafer W1. The upper cutting blade 33 may not lower to cut the laminate film, but the mounting plate 50 may be raised to raise the NCF laminated wafer W1, to cut the excessive portion NCFa of the laminate film such as NCF from the NCF laminated wafer W1 by the cutting blade 33. Furthermore, the laminate film such as NCF may be fusion cut by a heated blade or may be cut with the use of a cutting mechanism such as laser.

Inside of the round-shape cutting blade 33, a plurality of (four pieces in this embodiment) of sucking devices 51 consisting of rubber pads are disposed downward. Inside of the rubber pad is sucked by a negative pressure unit not shown. The sucking devices 51 are stretched by springs not shown. In the initial state, the sucking devices project to a lower position than the cutting blade 33. When the cutting mechanism 28 is further lowered after the sucking devices come into abutting contact with the NCF laminated wafer W1, the sucking devices become retracted to a higher position than the cutting blade 33.

To the member 49 of the cutting mechanism 28, a CCD camera 53, which is a detection mechanism for NCF laminated wafer W1, is attached. The CCD camera 53 can detect the position in the cutting stage S2 where the NCF laminated wafer W1 conveyed by the lower carrier film C1 has stopped. Instead of CCD camera, an optical, electronic or mechanical detection mechanism may be used. Under the lower carrier film C1 between the support columns 30 of the cutting device 13, the film tension mechanism 29, which imparts tension to the lower carrier film C1, is provided. The film tension mechanism 29 is provided with a round-shape mounting plate 50 which has an area larger, by a certain degree or above, than the area of the NCF laminated wafer W1 conveyed after lamination. In this embodiment, the mounting plate 50 is made of a metallic flat plate having a high degree of smoothness. It may be formed with another member such as glass plate affixed to the surface or another member removably affixed. Furthermore, it may have a center portion bloated or groove formed at the position corresponding to the position of the cutting blade.

The mounting plate 50 can be raised higher than the fixed position of the lower carrier film C1 by raising the rod 55a of the air cylinder 55 which is disposed to the board 54 mounted at a position lower than the lower carrier film C1 between the support columns 30. In this embodiment, the mounting plate 50 cannot move in the horizontal direction, but it may be configured so that the mounting plate 50 can move in the horizontal direction according to the position of NCF laminated wafer W1 as is the case of the cutting blade 33 of the cutting mechanism 28.

The servomotors 37, 44, the electric cylinder 47, the negative pressure unit of the sucking devices 51, the CCD camera 53 and the drive mechanism of the air cylinder 55 of the film tension mechanism 29 in the cutting device 13, as well as the batch type vacuum laminating device 12 and the conveying device 14 including the preceding process and the subsequent process, are connected to a control device not shown and sequentially controlled by the control device.

Next, the vacuum lamination method by the vacuum lamination system of the present invention will be described. There is no limitation on the laminate base item used in the present invention, but in this embodiment, lamination of wafer W made of silicon will be described. The diameters of wafers W are 4, 8, 12, 16 inches and so on, and most of wafers are round-shape. The thicknesses of wafers W are about from 0.025 mm to 0.8 mm. In view of the relationship with the cutting device 13, however, it is preferable that wafers having the same shape are continuously formed. In the present invention, since the batch type vacuum laminating device 12 is used, wafers W having bumps of 0.01 mm to 0.04 mm in height formed can be laminated in good quality. Wafers W having such bumps formed are difficult to be laminated in good quality by a roll laminator because a roll laminator may apply an excessively strong compression force, bumps may fall down due to a lateral force applied to them or voids may be formed between the bumps and the wafer. But the batch type vacuum laminating device 12, especially, the vacuum laminating device 12 (laminator) which applies compression by the compressed rubber membrane body 24 (diaphragm) can provide lamination in good quality.

First, an NCF that was cut by the cutter in the conveying/superposing device 19 in the preceding process not shown is superposed on the wafer W. One side of the cut NCF is larger than the diameter of the wafer W, and the entire surface of the wafer W is covered by the NCF. The NCF in the state of preservation has protection films such as PET (polyethylene terephthalate) laminated on both sides of the adhesive layer. The protection film on one side is delaminated, and the NCF is superposed on the wafer W with the adhesive layer being in abutting contact with the wafer W. At this time, either the case where the wafer W and a part of the adhesive layer are temporarily adhered or the case where they are not temporarily adhered is assumed.

In the present invention, a laminate film, which is laminated on a laminate base item, may be a film other than NCF, and a laminate material such as ABF film and a photosensitive film may not necessarily be excluded. For the type of resin, thermosetting film, plastic resin film or a mixture of thermosetting resin and thermoplastic resin may be used. In the present invention, there is no limitation on the thickness of a laminate film, and a material called sheet is also included in the laminate film. Furthermore, in this embodiment, the laminate film is cut into a rectangle having a predetermined length and superposed on an individual laminate base item for laminate molding, but a continuous belt-shaped film may be used. In that case, the laminate film is unwound from the unwinding roll and is laminated on a laminate base item by the vacuum laminating device 12, the peripheral portion other than the portion superposed on the laminate base item is cut by the cutting device 13, and the cut laminate film (which is belt-shaped and has holes punched) is wound by the wind-up roll. In the cutting device 13, in the case where the cut laminate film is divided, the cut laminate film may be wound up together with the lower carrier film C1. Moreover, the laminate film, either in the case where it is cut or the case where it is in a continuous belt-shaped form, may be mounted on the lower surface with a laminate base item being mounted on the film for laminate forming. Furthermore, the laminate film may be superposed on the top and the bottom of a laminate base item and be affixed on both sides of the laminate base item so as to sandwich the item. In that case, two laminate films are cut at the same time by the cutting device.

By the conveying/superposing device 19 in the preceding process, the set of a wafer W and an NCF is placed on the mounting stage S1 on the lower carrier film C1. Next, with the chamber 22 of the batch type vacuum laminating device 22 being open, the brakes for the unwinding rolls 15a, 15b of the upper and lower carrier films C1, C2 are released, the motors for the wind-up rolls 16a, 16b are driven, the side ends of the upper and lower carrier films C1, C2 are pulled toward the subsequent process by the zipped film conveying device 17 in the case where the zipped film conveying device 17 is mounted. Thus, the set of wafer W and NCF on the lower carrier film C1 is moved to the vacuum laminating device 12. On the set of wafer W and NCF, the lower carrier film C2 is superposed from the roller 18b located halfway, and the set of wafer W and NCF is conveyed into the lamination position in the chamber 22 of the batch type vacuum laminating device 12 while being sandwiched between the upper and lower carrier films C1, C2.

Next, the lower plate 21 of the vacuum laminating device 12 is raised, the chamber 22 is sealed, and then the inside of the chamber 22 is vacuumed. At that time, since the upper plate 20 and the lower plate 21 are heated, melting of the adhesive layer of NCF progresses even if the upper and lower plates are not directly in abutting contact with the wafer W and NCF. When the degree of vacuum reaches a predetermined value, compressed air is supplied to under the rubber membrane body 24 (diaphragm) on the lower plate side to bloat the rubber membrane body 24, and the wafer W and the NCF are pressed toward the rubber membrane body 25 on the upper plate side. The preferable compression force to be applied at this time is 0.1 MPa to 1.5 MPa as an example, but it is not limited to this. The preferable hardness of rubber for the rubber membrane body 24 (diaphragm) of the vacuum laminating device 12 is, as an example, the Type A durometer hardness (Shore A hardness) of 10 to 40 degrees by the measurement according to (JIS K-6253), but it is not limited to this. The preferable hardness of the rubber membrane body 25 on the upper plate 20 side to be pressed is 40 to 70 degrees, as one example, but it is not limited to this, and the hardness of the rubber membrane body 25 on the upper plate 20 is higher.

Since the wafer W and NCF are compressed via the upper and lower carrier films C1, C2, the NCF adhesive layer will not adhere to the rubber membrane bodies 24, 25 of the vacuum laminating device 12 even when the NCF adhesive layer is molten. In the case where the laminate film is a film that does not adhere to the device side or in the case where the vacuum laminating device 12 has a mechanism for preventing or removing adhesion of molten resin, the upper carrier film C2 is not necessarily required and only the lower carrier film C1 for conveying wafers W or the like is required. In the case where the upper carrier film C2 is not used, mainly, NCF or BG tape is unwound from the unwinding roll onto the upper surface of the wafer W, the portion that has not been adhered to the wafer after the lamination is cut and wound up by the wind-up roll.

After a predetermined compression time lapses, compression by the rubber membrane body 24 is ended and vacuum break in the chamber 22 is performed. Then, the lower plate 21 is lowered and the chamber 22 is opened. The laminated item, such as wafer, having the laminate film such as NCF laminated thereon (NCF laminated wafer W1) is conveyed to the next process. It goes without saying that at the time when the NCF laminated wafer W1 is conveyed, the wafer W and NCF which are laminated next are conveyed from the mounting stage S1 into the chamber 22 of the vacuum laminating device 12 as described above. In this embodiment, the zipped film conveying device 17 is disposed to perform an accurate conveyance. Therefore, the NCF laminated wafer W1 is stopped at the initial position where it is conveyed while being sandwiched between the upper and lower carrier films C1, C2. The zipped film conveying device 17 may not be disposed, but the upper carrier film C2 may be delaminated by the roll 27b before the position to which it is first conveyed and the excessive portion NCFa of NCF may be cut from the NCF laminated wafer W1 at the position to which it is first conveyed.

In this embodiment, the upper carrier film C2 is removed from the NCF laminated wafer W1 at a position between the first position where it is conveyed out and stopped after the lamination is completed and the second position where it is conveyed and stopped (cutting stage S2). Next, in the cutting stage S2, the NCF laminated wafer W1 is stopped. Each time the NCF laminated wafer W1 is conveyed, the position in the cutting stage S2 where it stops slightly varies due to an error in the feed rate of the lower carrier film C1 or a slight difference in the stretch rate of the lower carrier film C1. In the cutting stage S2, when the NCF laminated wafer W1 is stopped, first, the upper surface of the mounting plate 50 of the film tension mechanism 29 in the cutting device 13 is raised to a position higher than the lower carrier film C1 and stops. As a result, a certain degree or more of tension is applied to the lower carrier film C1, and at the same time, the position of the NCF laminated wafer W1 is fixed.

When the position of the NCF laminated wafer W1 is fixed, the CCD camera 53 of the upper cutting mechanism 28 detects the positional information of the NCF laminated wafer W1, the servomotors 37, 44 are individually driven corresponding to the positional information of the NCF laminated wafer W1, and the upper moving member 42 of the cutting mechanism 28 is moved. Since the upper moving member 42 and the cutting blade 33 and the like are freely movable in the XY direction on the horizontal plane as described above, a round-shape cutting blade 33 having a diameter slightly larger than the outside diameter of the wafer portion of the NCF laminated wafer W1 can be moved to the position in which the blade becomes concentric with the outer periphery of the wafer portion. Alternatively, in the device having a higher precision of the CCD camera or the conveying device, the inside diameter of the cutting blade 33 and the outer diameter of the wafer portion may be made much closer so that the portion of NCF that lies off to the outer periphery of the wafer portion in the NCF laminated wafer W2 after being cut is eliminated or reduced.

Figure 3:
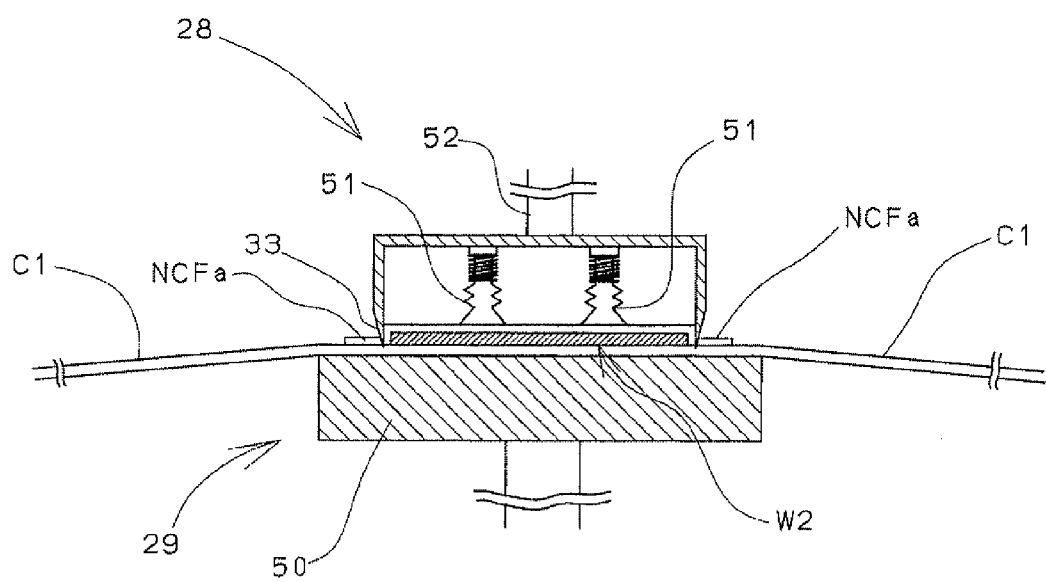
FIG. 3 is an enlarged cross-sectional view of the cutting portion of the vacuum lamination system according to the embodiment of the present invention.

After the positions of the upper moving member 42 and the cutting blade 33 are determined, the rod 47a of the electric cylinder 47 is extended to be brought the sucking devices 51 into abutting contact with the upper surface of the NCF portion of the NCF laminated wafer W1, which is sucked by the negative pressure unit. When the electric cylinder 47 is extended further, the springs of the sucking devices 51 are retracted and the round-shape cutting blade 33 comes into abutting contact with the NCF portion of the NCF laminated wafer W1. At this time, the cutting blade 33 is located on the outer peripheral side of the wafer W. As shown in FIG. 3, the position of the round-shape cutting blade 33 is controlled by closed-loop control so as to stop at a position where the NCF portion is completely cut, but a portion or all of the lower carrier film C1 is prevented from being cut. Thus, the entire lower carrier film C1 is left in a belt-shaped state and no round-shape cut-off piece is produced. The NCF portion that was originally a rectangle is punched off along the shape of the wafer and the excessive portion NCFa of NCF is remained on the lower carrier film C1.

In this embodiment, along the outer periphery of the wafer portion of the NCF laminated wafer W1, the NCF portion is cut. But the NCF portion may be cut on a portion inside of the outer periphery of the wafer portion of the NCF laminated wafer W1. In this case, the NCF portion is removed from the NCF wafer W2 and the wafer portion is partially exposed. In this embodiment, the lower carrier film C1 is not cut by control of the electric cylinder 47. In the vicinity of the cutting blade 33, a projection whose thickness is the same as or smaller than that of the lower carrier film C1 and which is slightly projected from the cutting blade 33 may be provided, and when the projection comes in contact with the mounting plate 50, the cutting blade 33 may be configured to stop at the position where the lower carrier film C1 is not at least completely cut off. Alternatively in the vicinity of the cutting blade 33, a touch surface whose thickness is the same as that of the NCF and which is retreatedly disposed from the cutting blade 33 may be provided, and when the touch surface comes in contact with the surface of the NCF, the cutting blade 33 may be configured to stop at the position where the lower carrier film C1 is not at least completely cut off. When cutting the excessive portion NCFa of NCF by the cutting device 13, in parallel, the vacuum laminating device 12 carries out the following lamination of the wafer W and the NCF.

Then, the electric cylinder 47 of the cutting mechanism 28 is raised, the cutting blade 33 is raised, and the NCF laminated wafer W2 having the round-shape NCF portion affixed thereto is sucked by the sucking devices 51 and raised. Thereafter, the servomotor 37 is operated to move the carriage 34 to the position over the convey-out stage S3 of the NCF laminated wafer W2 which is the next subsequent process, the electric cylinder 47 is operated again to lower the sucking devices 51 and stop the negative pressure suction of the sucking devices 51 and the NCF laminated wafer W2 is mounted on the conveying device in the subsequent process. The excessive portion NCFa of NCF is wound up together with the lower carrier film C1 by the wind-up roll 16a when it is fed by the lower carrier film C1 in the next and subsequent operations while being affixed to the lower carrier film C1. Therefore, a cut film removing device does not need to be disposed, separately. In the present invention, the excessive portion of the laminate film can be cut on the lower carrier film C1. Therefore, compared to the case where the cutting device 13 is separately disposed at a position different from the lower carrier film C1, the cutting process can be simplified by omission of at least one robot for conveyance, making the installation layout more compact, and so on. In particular, since these devices are mounted in a clean room, making the layout of the cutting process compact has a significant effect.

The vacuum lamination system and the vacuum lamination method of the present invention are used in the subsequent processes after the device for affixing the laminate film to wafer, circuit board and surface having fine convexes and concaves, and there is no limitation on the type of laminate base item.

What is claimed is:

1. A vacuum lamination system comprising:
    a batch type vacuum laminating device configured to laminate a laminate film and a laminate base item, which are conveyed on a lower carrier film, and the laminate film and the laminate base item are disposed in between the lower carrier film and an upper carrier film;
    a cutting stage comprising:
        a roll configured for delaminating the upper carrier film which is disposed at a position where the upper carrier film is removed, and the lower carrier film is fed, and
        a wind-up roll configured for winding up the upper carrier film after removal of the upper carrier film, wherein the cutting stage is located where the lower carrier film is horizontally conveyed by a predetermined length beyond the position where the upper carrier film is removed;
    a cutting mechanism which is disposed over the cutting stage and includes a round-shape cutting blade or blade configured to move on a round-shape arc, the cutting mechanism further comprising a plurality of servomotors configured to raise and lower the cutting mechanism, and configured to move the cutting mechanism in the horizontal direction by detecting the laminate base item with a detection mechanism; and
    a film tension mechanism comprising a mounting plate which is disposed in a position lower than the lower carrier film at the cutting stage, wherein the mounting plate is configured to be raised higher than the fixed position of the lower carrier film to raise the lower carrier film to impart tension to the lower carrier film, wherein
    in a state in which the laminated item having the laminate film laminated thereon is mounted on the lower carrier film, the cutting mechanism is configured to cut an excessive portion of the laminate film from the laminated item having the laminate film laminated thereon,
    the laminate base item is a round-shape wafer and the laminate film is a continuous laminate film or a laminate film cut into a rectangle, and
    the cutting mechanism is configured to cut the laminate film in accordance with a shape of the laminate base item.

2. The vacuum lamination system according to claim 1, wherein the cutting state is further configured to wind up the cut-off excessive portion of the laminate film together with the lower carrier film.

3. A vacuum lamination method of using the system according to claim 1, the method comprising the steps of:
    laminating the laminate film and the laminate base item by the batch type vacuum laminating device; and
    cutting the laminate film from the laminated item having the laminate film laminated thereon.

4. The vacuum lamination method according to claim 3, wherein the cut-off excessive portion of the laminate film is wound up together with the lower carrier film.

* * * * *